(12) United States Patent
Yang et al.

(10) Patent No.: US 7,709,275 B2
(45) Date of Patent: May 4, 2010

(54) METHOD OF FORMING A PATTERN FOR A SEMICONDUCTOR DEVICE AND METHOD OF FORMING THE RELATED MOS TRANSISTOR

(75) Inventors: Min-Chieh Yang, Kao-Hsiung (TW); Lung-En Kuo, Chiayi County (TW)

(73) Assignee: United Microelectronics Corp., Hsin-Chu (TW)

( * ) Notice: Subject to any disclaimer, the term of this patent is extended or adjusted under 35 U.S.C. 154(b) by 14 days.

(21) Appl. No.: 12/101,122

(22) Filed: Apr. 10, 2008

(65) Prior Publication Data

US 2009/0258500 A1    Oct. 15, 2009

(51) Int. Cl.
 *H01L 21/00*    (2006.01)
(52) U.S. Cl. .......................................................... 438/3
(58) Field of Classification Search ........................ None
 See application file for complete search history.

(56) References Cited

U.S. PATENT DOCUMENTS

2002/0063275 A1 *  5/2002  Chang ........................ 257/315
2007/0212795 A1 *  9/2007  Milkove et al. ................ 438/3
2009/0087990 A1 *  4/2009  Yatsuda et al. .............. 438/694

* cited by examiner

*Primary Examiner*—Charles D Garber
*Assistant Examiner*—Andre' C Stevenson
(74) *Attorney, Agent, or Firm*—Winston Hsu

(57) ABSTRACT

A method of forming a pattern for a semiconductor device, in which, two hard masks are included between an upper spin-on glass (SOG) layer and a lower etching target layer. The SOG layer is etched twice through two different patterned photoresists respectively to form a fine pattern in the SOG layer. Subsequently, an upper hard mask is etched by utilizing the patterned SOG layer as an etching mask so the upper patterned hard mask can have a fine pattern with a sound shape and enough thickness. A lower hard mask and the etching target layer are thereafter etched by utilizing the upper patterned hard mask as an etching mask, so portions of the etching target layer that are covered by the two hard masks can be well protected from the etching processes.

20 Claims, 9 Drawing Sheets

METHOD OF FORMING A PATTERN FOR A SEMICONDUCTOR DEVICE AND METHOD OF FORMING THE RELATED MOS TRANSISTOR

BACKGROUND OF THE INVENTION

1. Field of the Invention

The present invention relates to a semiconductor fabrication, and more particularly, to a method of forming a pattern for a semiconductor device.

2. Description of the Prior Art

As sizes of semiconductor devices are designed as small as possible to catch up with the tendency of miniaturization, the patterning process becomes more and more important nowadays. In a traditional patterning process, the photoresist is patterned by one photolithography process, and thereafter serves as an etching mask for etching the underlying material layer. However, the miniaturization is limited by the exposing ability of current lithographic tools in traditional patterning process, because every lithographic tool has its critical exposure resolution of exposing gaps between lines and between spaces.

Accordingly, another pattern forming approach including two photolithography processes and one etching process is adopted when the pitch (the distance of centers of two neighboring structures) is smaller than 155 nanometers (nm). Please refer to FIG. 1, which is a schematic diagram illustrating the pattern forming approach including two photolithography processes. As shown in FIG. 1, one target pattern 10, which is designed for a semiconductor device (not shown), is divided into two partial patterns 12. Thus, the pitch of the target pattern 10 can be much smaller than the pitches of the partial patterns 12, while the pitches of the partial patterns 12 should relate to the critical exposure resolution of the lithographic tool (not shown). As a result, the pitch of the target pattern 10 can be superior to the critical exposure resolution of the lithographic tool.

However, it is still some problems for applying the concept to various patterning processes in practice. When the pitch of contact holes is lower than 140 nm, the above-mentioned two-exposures-then-one-etching method fails because it is beyond the limitation of the current lithographic tools during the second exposure, and consequently contact holes lower than 140 nm pitch cannot be produced.

SUMMARY OF THE INVENTION

The objective of the present invention is to provide a method of forming a pattern for a semiconductor device, and a method of forming the related MOS transistor so that a finer pattern can be well transferred to an etching target layer.

The method of forming a pattern for a semiconductor device according to the present invention comprises steps as follows. First, a stacked structure is provided. The stacked structure includes a substrate, an etching target layer disposed on the substrate, a first hard mask disposed on the etching target layer, a second hard mask disposed on the first hard mask, a spin-on glass (SOG) layer disposed on the second hard mask, and a first patterned photoresist disposed on the SOG layer. Subsequently, a first etching process is performed on the SOG layer to transfer a first pattern to the SOG layer by utilizing the first patterned photoresist as an etching mask. Next, the first patterned photoresist is removed. Furthermore, a second patterned photoresist is formed on the SOG layer having the first pattern. Next, a second etching process is performed on the SOG layer to transfer a second pattern to the SOG layer by utilizing the second patterned photoresist as an etching mask. Following that, the second patterned photoresist is removed. Thereafter, the second hard mask is etched by utilizing the patterned SOG layer as an etching mask. Afterward, the first hard mask and the etching target layer are etched by utilizing the patterned second hard mask as an etching mask.

In another aspect of the present invention, the second hard mask includes an amorphous carbon layer disposed on the first hard mask, and a dielectric anti-reflection coating (DARC) layer disposed on the amorphous carbon layer.

The SOG layer is used for having a finer pattern defined by a 2P2E process (a process of forming a pattern in a material layer through two photolithographic exposures and two etching processes). Since the SOG layer may become thinner due to two etching processes, the fine pattern is transferred to the second hard mask so the patterned second hard mask can have a fine pattern with a sound shape and enough thickness. The patterned second hard mask can protect both the covered portions of the first hard mask and the covered portions of the etching target layer in the following process of etching the etching target layer, while the first hard mask can also protect the etching target layer. Therefore, both the patterned first hard mask and the patterned etching target layer can have sound shapes. Accordingly, the patterned etching target layer can be further protected in the subsequent procedures, such as another etching process or an epitaxial growth process, by the well patterned first hard mask.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a patterning method, where two hard masks are included between a lower etching target layer and an upper SOG layer patterned by a 2P2E process. Methods of the present invention can be applied to any semiconductor patterning process to form a well-patterned structure, such as a gate, an interlevel dielectric (ILD) contact hole or an STI structure.

Figure 1:
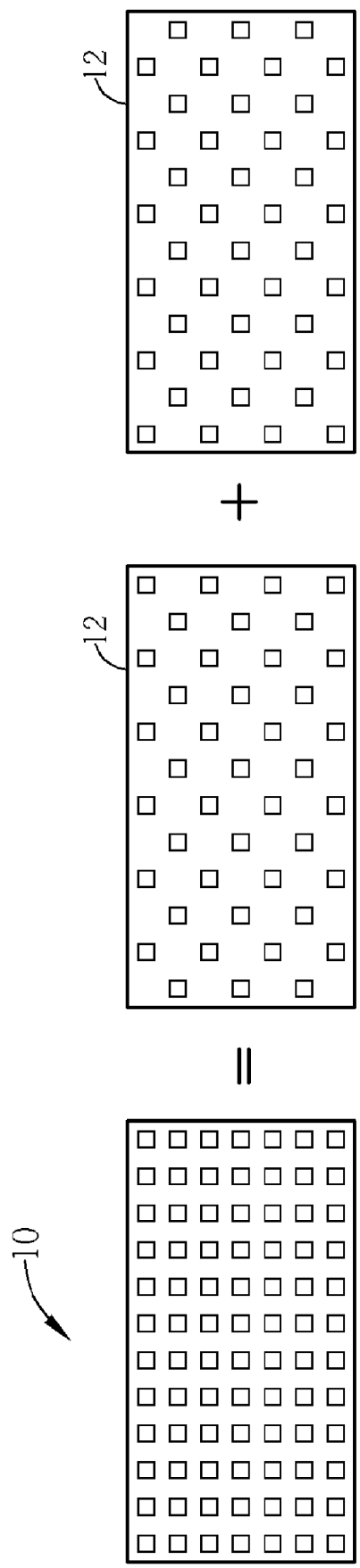
FIG. 1 is a schematic diagram illustrating a conventional pattern forming approach including two photolithography processes.
Figure 2:
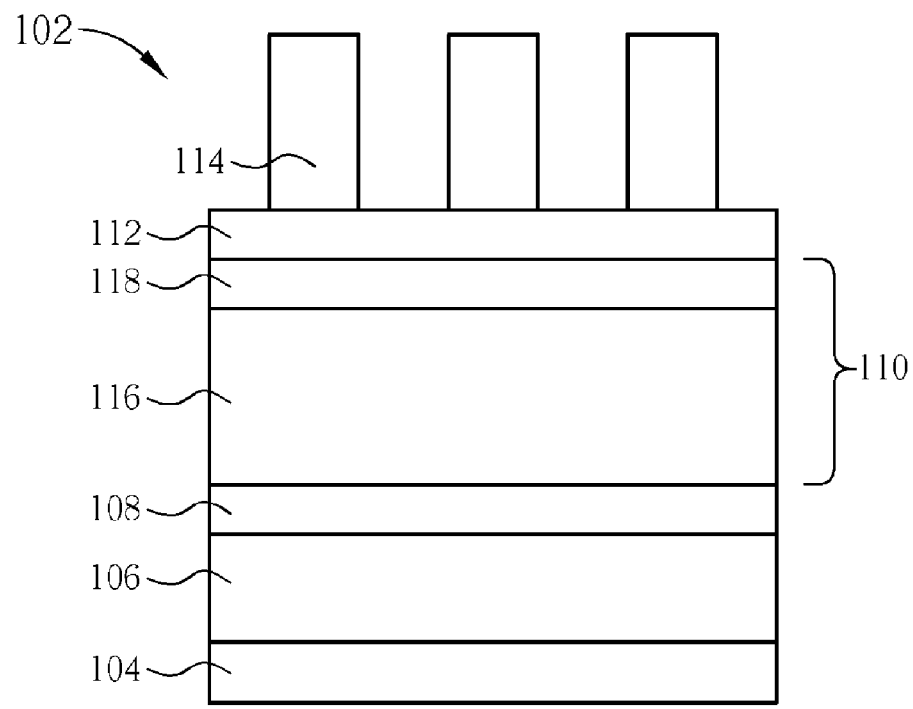
FIGS. 2 through 9 are schematic diagrams illustrating a method of forming a pattern for a semiconductor device according to an embodiment of the present invention.
Figure 3:
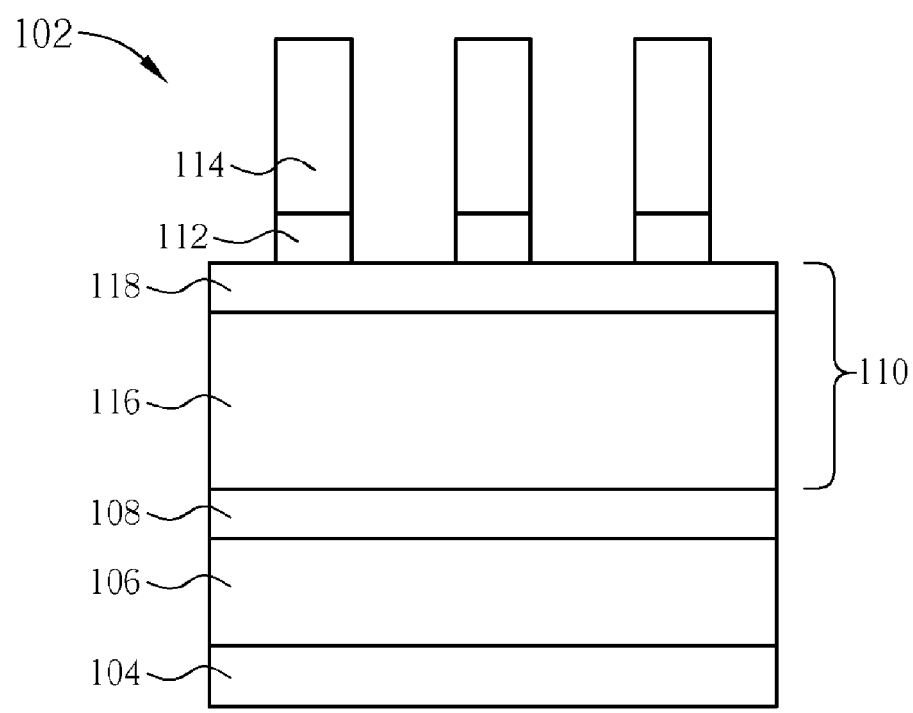
Figure 4:
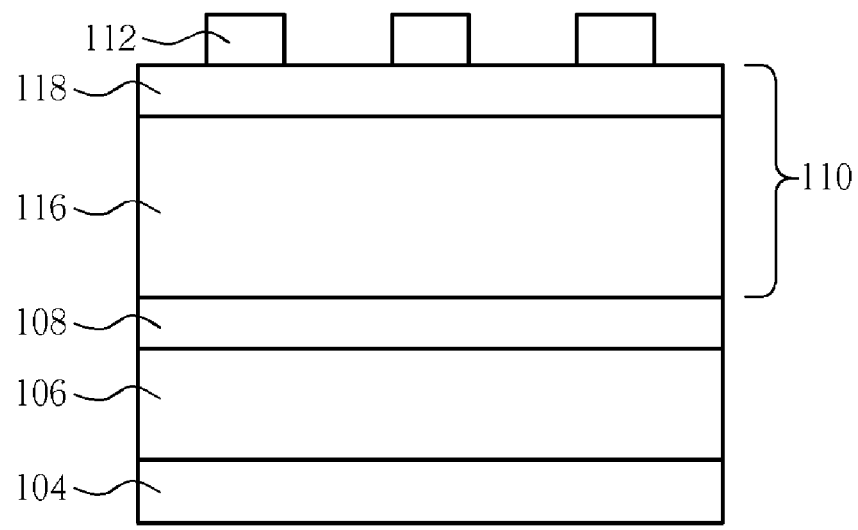
Figure 4A:
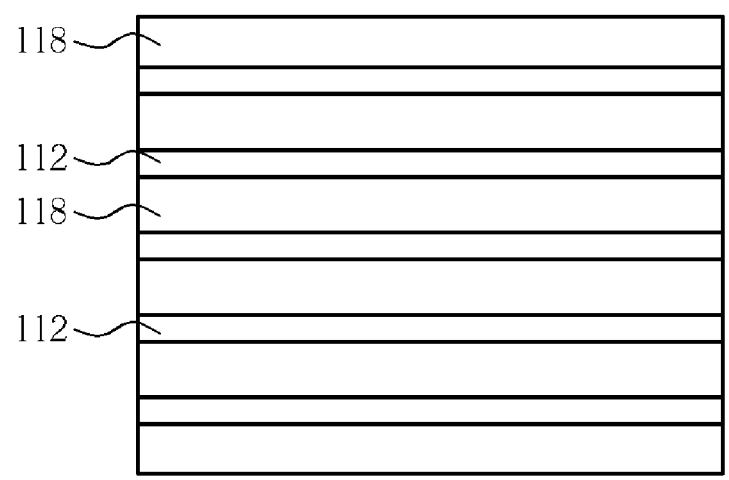
Figure 5:
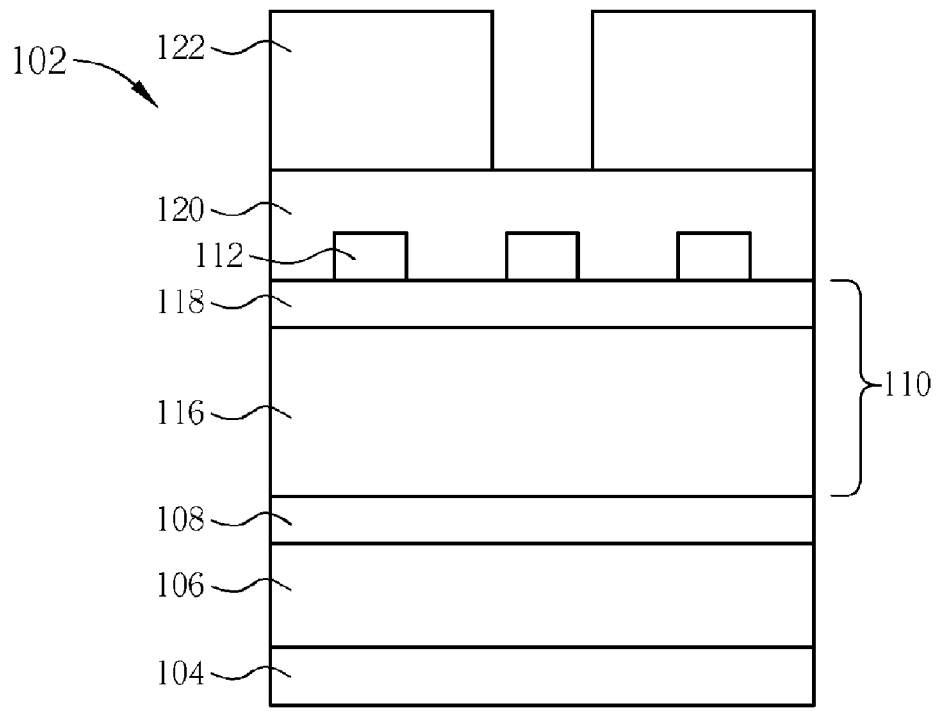
Figure 6:
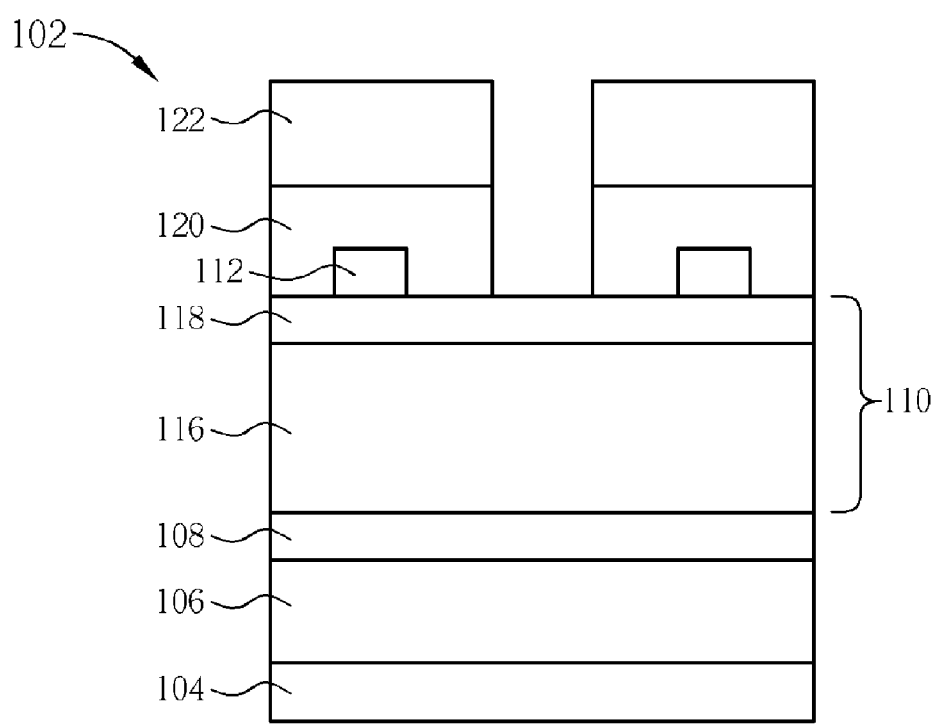
Figure 7:
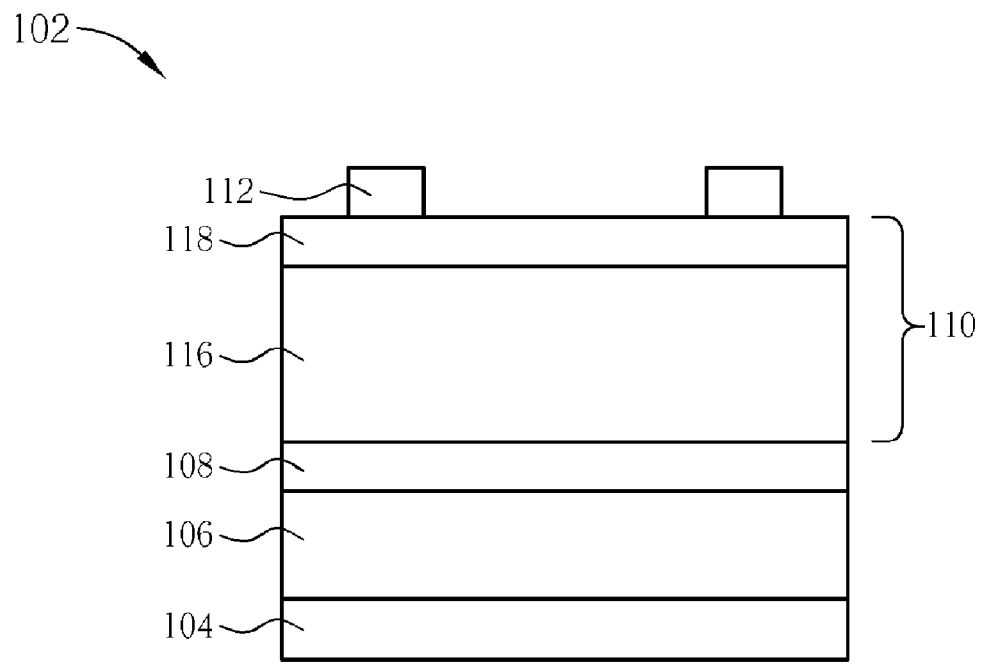
Figure 7A:
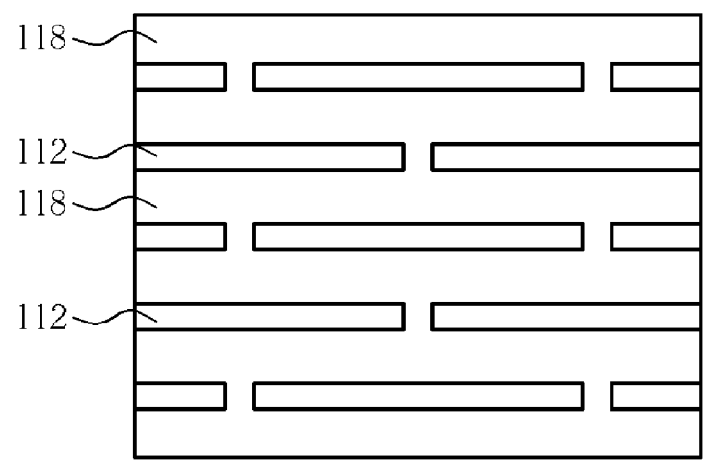

FIGS. 2 through 9 indicate a method of forming a pattern for a semiconductor device according to an embodiment of the present invention, where FIG. 4A shows the top-view of the semiconductor structure shown in FIG. 4, and FIG. 7A shows the top-view of the semiconductor structure shown in FIG. 7. First, as shown in FIG. 2, a stacked structure 102 is provided. The stacked structure 102 includes a substrate 104, an etching target layer 106 disposed on the substrate 104, a first hard mask 108 disposed on the etching target layer 106, a second hard mask 110 disposed on the first hard mask 108, a SOG layer 112 disposed on the second hard mask 110, and a first patterned photoresist 114 disposed on the SOG layer 112, where the second hard mask 110 includes an amorphous carbon layer 116 disposed on the first hard mask 108, and a DARC layer 118 disposed on the amorphous carbon layer 116.

The substrate 104 may be a semiconductor or SOI substrate. The etching target layer 106 can be a single film, or includes multiple material films. The first hard mask 108 can include oxide, silicon nitride ($Si_xN_y$), silicon-rich nitride, silicon oxynitride or silicon carbide, but not limited thereto. The DARC layer 118 can include silicon nitride, oxide, SiON or SiC, and functions to protect the amorphous carbon layer 116 from being damaged during photoresist removing. The first patterned photoresist 114 can include any photosensitive materials, such as 193 nm photoresist, which may be relatively thin, and accordingly, the resolution may be improved. In other embodiments, the second hard mask 110 can contain amorphous carbon, SiN, oxide, SiON, SiC or any combination thereof.

Subsequently, as shown in FIG. 3, an etching process, such as dry etching, is performed on the SOG layer 112 to transfer a first pattern to the SOG layer 112 by utilizing the first patterned photoresist 114 as an etching mask. Next, as shown in FIG. 4 and FIG. 4A, the remaining first patterned photoresist 114 is removed, and the first pattern of the SOG layer 112 is visible in top-view.

Furthermore, as shown in FIG. 5, a bottom anti-reflection coating (BARC) layer 120 is formed on the SOG layer 112 having the first pattern, and thereafter a second patterned photoresist 122 is formed on the BARC layer 120. The BARC layer 120 can fill openings of the SOG layer 112, and can contain 365 nm (I-line) photoresist, which may improve adhesion and provide a function of anti-reflection. The second patterned photoresist 122 can include any photosensitive materials, such as 193 nm photoresist.

Next, as shown in FIG. 6, another etching process is performed on the BARC layer 120 and the SOG layer 112 to transfer a second pattern to the SOG layer 112 by utilizing the second patterned photoresist 122 as an etching mask, while portions of the BARC layer 120 not covered by the second patterned photoresist 122 are also etched. Following that, as shown in FIG. 7 and FIG. 7A, the remaining second patterned photoresist 122 and the remaining BARC layer 120 are removed. A target pattern, which is a combination of the first and second patterns, is shown in top-view. The SOG layer 112 is used for having the finer pattern defined by the 2P2E process, while the SOG layer 112—is thinner due to the two etching processes.

Figure 8:
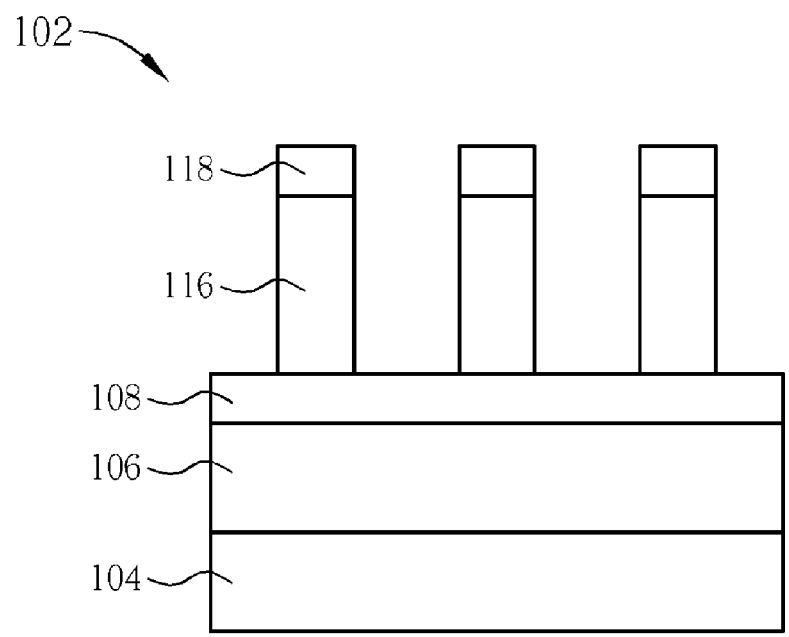

Thereafter, as shown in FIG. 8, another etching process is carried out on the second hard mask 110 by utilizing the patterned SOG layer 112 as an etching mask, so the target pattern can be transferred to the second hard mask 110. It is noted that the patterned SOG layer 112 is exposed and etched during this etching process, so it may be totally consumed after this etching process. This explains the absence of the SOG layer 112 in FIG. 8. Furthermore, the thickness of the SOG layer is well selected so that the thickness is enough to protect the underlying second hard mask but not remained too much after this etching process. Since the second hard mask 110 can be prevented from suffering the 2P2E process, the patterned second hard mask 110 can have a finer pattern with a sound shape and enough thickness (the target pattern).

Figure 9:
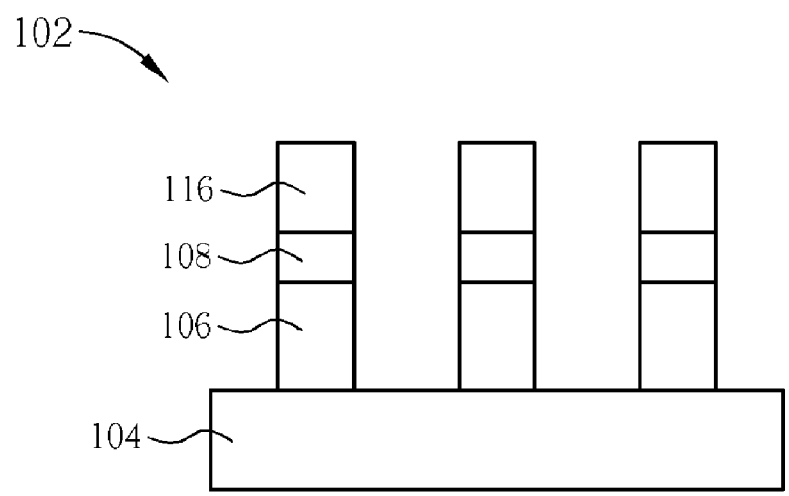

Afterward, as shown in FIG. 9, another etching process is carried out on the first hard mask 108 and the etching target layer 106 by utilizing the patterned second hard mask 110 as an etching mask. In this etching procedure, the thickness of the whole second hard mask 110 is reduced. Generally, the DARC layer 118 may be completely consumed. The patterned second hard mask 110 can protect both the covered portions of the first hard mask 108 and the covered portions of the etching target layer 106 in this etching process, while the first hard mask 108 can also protect the etching target layer 106 simultaneously. Therefore, both the patterned first hard mask 108 and the patterned etching target layer 106 can have sound shapes and enough thicknesses.

Figure 10:
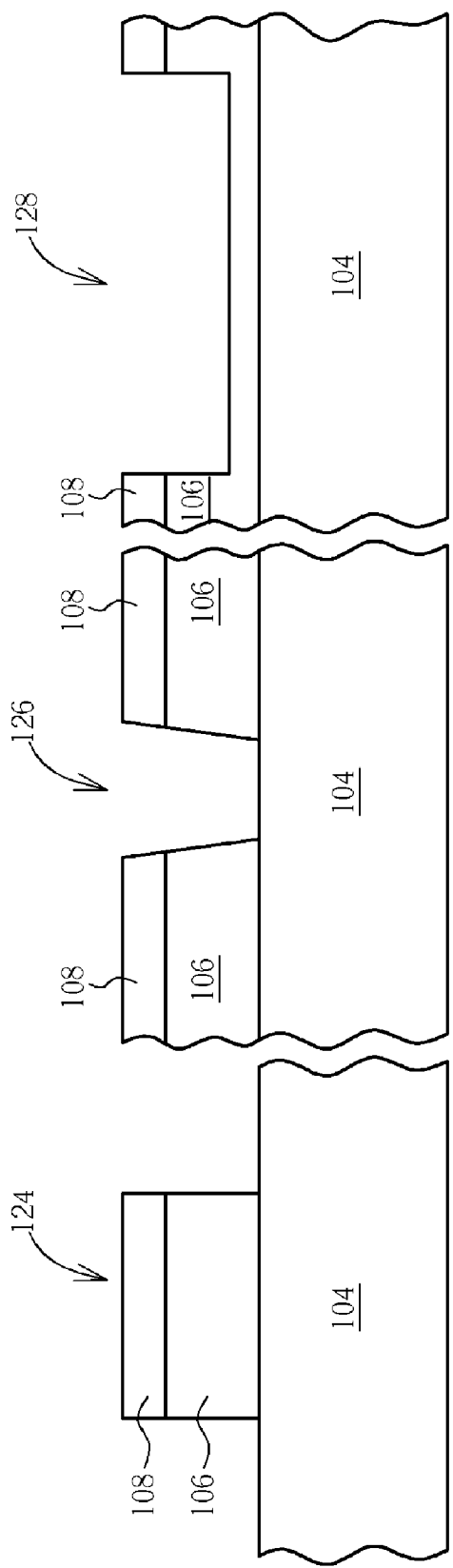
FIG. 10 is a schematic diagram illustrating various semiconductor structures according to some embodiments of the present invention.

Some embodiments of the present invention are described hereinafter to show various semiconductor structures formed by the above method of the present invention, as shown in FIG. 10, where the amorphous carbon layer 116 is removed after the etching target layer 106 is partially etched. It should be noted that like numbered numerals designate similar or the same parts, regions or elements. According to the above method, different patterns can be formed in different etching target layer having various materials. As FIG. 10 diagrammatically shows, a gate 124 of a MOS transistor (this etching target layer 106 includes a single or composite gate dielectric layer and a conductive layer, such as poly-silicon or metal, disposed on the gate dielectric layer), a plug hole 126, such as an ILD contact hole or an IMD via hole, (this etching target layer 106 can be ILD or IMD film stack, including oxide, SiC, SiON, SiN, low-k material, metal material or any combination thereof) and a STI recess 128 (this etching target layer 106 is a film stack composed of a substrate material such as Si, a thin dielectric layer such as an oxide layer and a hard mask layer such as a SiN layer) can be formed according to the above method.

Figure 11:
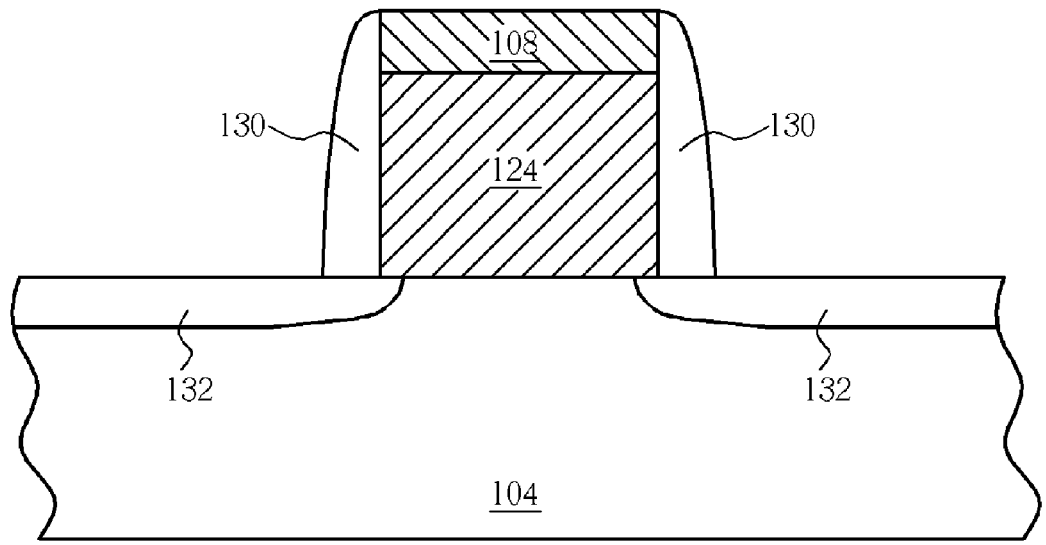
FIGS. 11 through 13 are schematic diagrams illustrating a method of forming a MOS transistor in the present invention.
Figure 12:
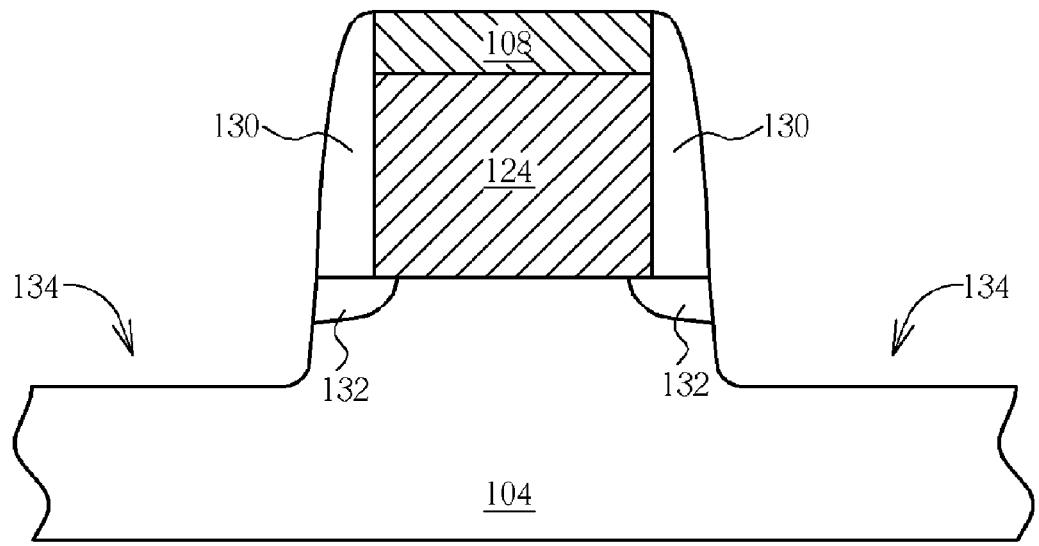
Figure 13:
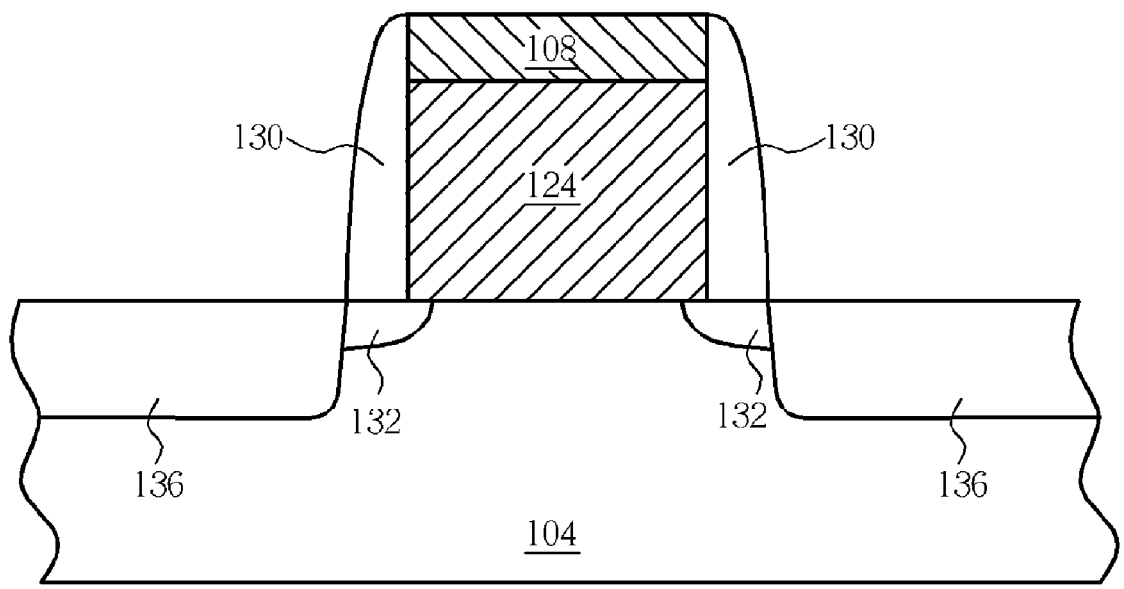

The resulting stacked structure 102 may be subsequently processed after etching target layer is patterned as desired in other semiconductor manufacturing processes. For example, the patterned first hard mask 108 can be removed from the surface of the patterned etching target layer 106, or can be kept to protect the patterned etching target layer 106 in the subsequent procedures, such as another etching process, an epitaxial growth process according to the process design. FIGS. 11 through 13 indicate a method of forming a MOS transistor in the present invention, where the gate 124 of this MOS transistor is formed by the method shown in FIG. 2 through FIG. 9, and therefore has a structure similar to the gate 124 shown in FIG. 10.

As shown in FIG. 11, an ion implantation process can be optionally performed to form lightly doped drains (LDD) 132 in the substrate 104 at opposite sides of the gate 124. Thereafter, a spacer 130 is formed on the sidewall of the gate 124. The spacer may include an L-shaped or linear offset spacer, D-shaped spacer, of a combination thereof and comprise a material such as oxide or nitride.

Next, as shown in FIG. 12, the exposed portions of the substrate 104, i.e. the predetermined regions for recess, is partially removed using the patterned first hard mask layer 108 and the spacer 130 as an etching mask to form recesses 134 in the substrate 104. The process for forming the recesses 134 may be dry etching and/or wet etching.

Afterward, as shown in FIG. 13, an epitaxial growth process, such as selective epitaxial growth (SEG) process, is performed to form an epitaxial layer 136 in each of the recesses 134. For example, a SiGe epitaxial layer may be used for manufacturing a PMOS, and a SiC epitaxial layer may be used for manufacturing an NMOS, but not limited thereto. The epitaxial layer may rise to have a height greater than that of the top plane of the original substrate. Since the patterned first hard mask 108 can have a sound shape and enough thickness, the patterned first hard mask 108 can further protect the underlying gate 124 from being exposed to the epitaxial growth process, and avoids gate bumps.

In the subsequent procedures, the patterned first hard mask 108 can be removed form the surface of the patterned etching target layer 106, or can be kept to protect the patterned etching target layer 106 as required.

In sum, the present invention not only can form a finer pattern in the etching target layer, but also can provide great protection to the etching target layer in the manufacturing processes. In addition, the method of the present invention is easily integrated with current processes and has a low cost, and accordingly can be well applied to semiconductor manufacturing processes.

Those skilled in the art will readily observe that numerous modifications and alterations of the device and method may be made while retaining the teachings of the invention.

What is claimed is:

1. A method of forming a pattern for a semiconductor device, comprising:
providing a stacked structure, the stacked structure comprising a substrate, an etching target layer disposed on the substrate, a first hard mask disposed on the etching target layer, a second hard mask disposed on the first hard mask, a spin-on glass (SOG) layer disposed on the second hard mask, and a first patterned photoresist disposed on the SOG layer;
performing a first etching process on the SOG layer by utilizing the first patterned photoresist as an etching mask so as to turn the SOG layer into an etched SOG layer;
removing the first patterned photoresist;
forming a second patterned photoresist on the etched SOG layer;
performing a second etching process on the etched SOG layer by utilizing the second patterned photoresist as an etching mask so as to turn the etched SOG layer into a patterned SOG layer;
removing the second patterned photoresist;
etching the second hard mask by utilizing the patterned SOG layer as an etching mask so as to turn the second hard mask into an patterned second hard mask; and
etching the first hard mask and the etching target layer by utilizing the patterned second hard mask as an etching mask.

2. The method of claim 1, wherein the etching target layer is a stack of IMD or ILD film.

3. The method of claim 2, wherein the etching target layer comprises oxide, SiC, SiON, SiN, low-k material, metal material, metal nitride or any combination thereof.

4. The method of claim 1, wherein the etching target layer comprises a gate dielectric layer and a conductive layer disposed on the gate dielectric layer.

5. The method of claim 1, wherein the etching target layer is a film stack composed of silicon, oxide and nitride.

6. The method of claim 1, wherein the first hard mask comprises oxide, SiN, SiC, SiON or a combination thereof.

7. The method of claim 1, wherein the second hard mask comprises amorphous carbon, SiN, oxide, SiON, SiC or any combination thereof.

8. The method of claim 1, further comprising a step of forming a bottom anti-reflection coating (BARC) layer on the etched SOG layer before forming the second patterned photoresist.

9. A method of forming a pattern for a semiconductor device, comprising:
providing a stacked structure, the stacked structure comprising a substrate, an etching target layer disposed on the substrate, a hard mask disposed on the etching target layer, an amorphous carbon layer disposed on the hard mask, a dielectric anti-reflection coating (DARC) layer disposed on the amorphous carbon layer, a SOG layer disposed on the DARC layer, and a first patterned photoresist disposed on the SOG layer;
performing a first etching process on the SOG layer by utilizing the first patterned photoresist as an etching mask so as to turn the SOG layer into an etched SOG layer;
removing the first patterned photoresist;
forming a second patterned photoresist on the etched SOG layer;
performing a second etching process on the etched SOG layer by utilizing the second patterned photoresist as an etching mask so as to turn the etched SOG layer into a patterned SOG layer;
removing the second patterned photoresist;
etching the DARC layer and the amorphous carbon layer by utilizing the patterned SOG layer as an etching mask so as to turn the amorphous carbon layer into a patterned amorphous carbon layer; and
etching the hard mask and the etching target layer by utilizing the patterned amorphous carbon layer as an etching mask.

10. The method of claim 9, wherein the etching target layer is a stack of IMD or ILD film.

11. The method of claim 10, wherein the etching target layer comprises oxide, SiC, SiON, SiN, low-k material, metal material, metal nitride or any combination thereof.

12. The method of claim 9, wherein the etching target layer comprises a gate dielectric layer and a conductive layer disposed on the gate dielectric layer.

13. The method of claim 9, wherein the etching target layer is a film stack composed of silicon, oxide and nitride.

14. The method of claim 9, wherein the hard mask comprises oxide or nitride.

15. The method of claim 9, further comprising a step of forming a BARC layer on the etched SOG layer before forming the second patterned photoresist.

16. A method of forming a MOS transistor, comprising:
providing a stacked structure, the stacked structure comprising a substrate, an etching target layer disposed on the substrate, a first hard mask disposed on the etching target layer, a second hard mask disposed on the first hard mask, a SOG layer disposed on the second hard mask, and a first patterned photoresist disposed on the SOG layer;
performing a first etching process on the SOG layer by utilizing the first patterned photoresist as an etching mask so as to turn the SOG layer into an etched SOG layer;
removing the first patterned photoresist;
forming a second patterned photoresist on the etched SOG layer;
performing a second etching process on the etched SOG layer by utilizing the second patterned photoresist as an etching mask so as to turn the etched SOG layer into a patterned SOG layer;
removing the second patterned photoresist;
etching the second hard mask by utilizing the patterned SOG layer as an etching mask;
etching the first hard mask and the etching target layer by utilizing the patterned second hard mask as an etching mask so as to turn the etching target layer into at least a gate covered by the patterned first hard mask;
forming a spacer disposed on a sidewall of the gate;

etching the substrate by utilizing the patterned first hard mask and the spacer as an etching mask to form at least a recess in the substrate; and performing an epitaxial growth process for forming an epitaxial layer in the recess, the patterned first hard mask protecting the gate from being exposed to the epitaxial growth process.

17. The method of claim 16, wherein the etching target layer comprises a gate dielectric layer and a conductive layer disposed on the gate dielectric layer.

18. The method of claim 16, wherein the first hard mask comprises oxide or SiN.

19. The method of claim 16, wherein the second hard mask comprises amorphous carbon, SiN, oxide, SiON, SiC or any combination thereof.

20. The method of claim 16, further comprising a step of forming a BARC layer on the etched SOG layer before forming the second patterned photoresist.

* * * * *